(12) United States Patent
Lin

(10) Patent No.: US 9,337,158 B2
(45) Date of Patent: May 10, 2016

(54) INTEGRATED CIRCUIT DEVICE AND ELECTROSTATIC DISCHARGE PROTECTION DEVICE THEREOF

(71) Applicant: Advanced Analog Technology, Inc., Hsinchu (TW)

(72) Inventor: Shuo-Yen Lin, Zhubei (TW)

(73) Assignee: Advanced Analog Technology, Inc., Hsinchu (TW)

( * ) Notice: Subject to any disclaimer, the term of this patent is extended or adjusted under 35 U.S.C. 154(b) by 0 days.

(21) Appl. No.: 14/640,546

(22) Filed: Mar. 6, 2015

(65) Prior Publication Data
US 2016/0104683 A1      Apr. 14, 2016

(30) Foreign Application Priority Data
Oct. 9, 2014   (TW) .............................. 103135145 A

(51) Int. Cl.
| | |
|---|---|
| *H01L 23/60* | (2006.01) |
| *H01L 27/02* | (2006.01) |
| *H01L 23/528* | (2006.01) |
| *H01L 23/58* | (2006.01) |
| *H01L 49/02* | (2006.01) |
| *H01L 29/10* | (2006.01) |

(52) U.S. Cl.
CPC ............ *H01L 23/60* (2013.01); *H01L 23/5286* (2013.01); *H01L 23/585* (2013.01); *H01L 27/0288* (2013.01); *H01L 27/0292* (2013.01); *H01L 28/20* (2013.01); *H01L 28/40* (2013.01); *H01L 29/1095* (2013.01)

(58) Field of Classification Search
CPC ............................ H01L 27/0251; H01L 23/60
See application file for complete search history.

(56) References Cited

U.S. PATENT DOCUMENTS

2015/0331985  A1*  11/2015  Sharma et al. .......... H01L 23/60

\* cited by examiner

*Primary Examiner* — Marc Armand
(74) *Attorney, Agent, or Firm* — C. G. Mersereau; Nikolai & Mersereau, P.A.

(57) ABSTRACT

An integrated circuit (IC) device includes an IC and an electrostatic discharge (ESD) protection device. The IC has a substrate, a core and a power mesh. The power mesh has a power electrode, a grounding electrode and a seal ring. The core is formed inside the grounding electrode. The power electrode is formed between the seal ring and the grounding electrode. The ESD protection device has multiple switch triggering units, multiple switching units and multiple discharging units formed on the substrate and electrically connected between the power electrode and the grounding electrode. The switching units turn on corresponding discharging units upon detecting occurrence of ESD to guide static electricity on the power electrode to the grounding electrode, thereby preventing the core from being damaged by static electricity.

31 Claims, 19 Drawing Sheets

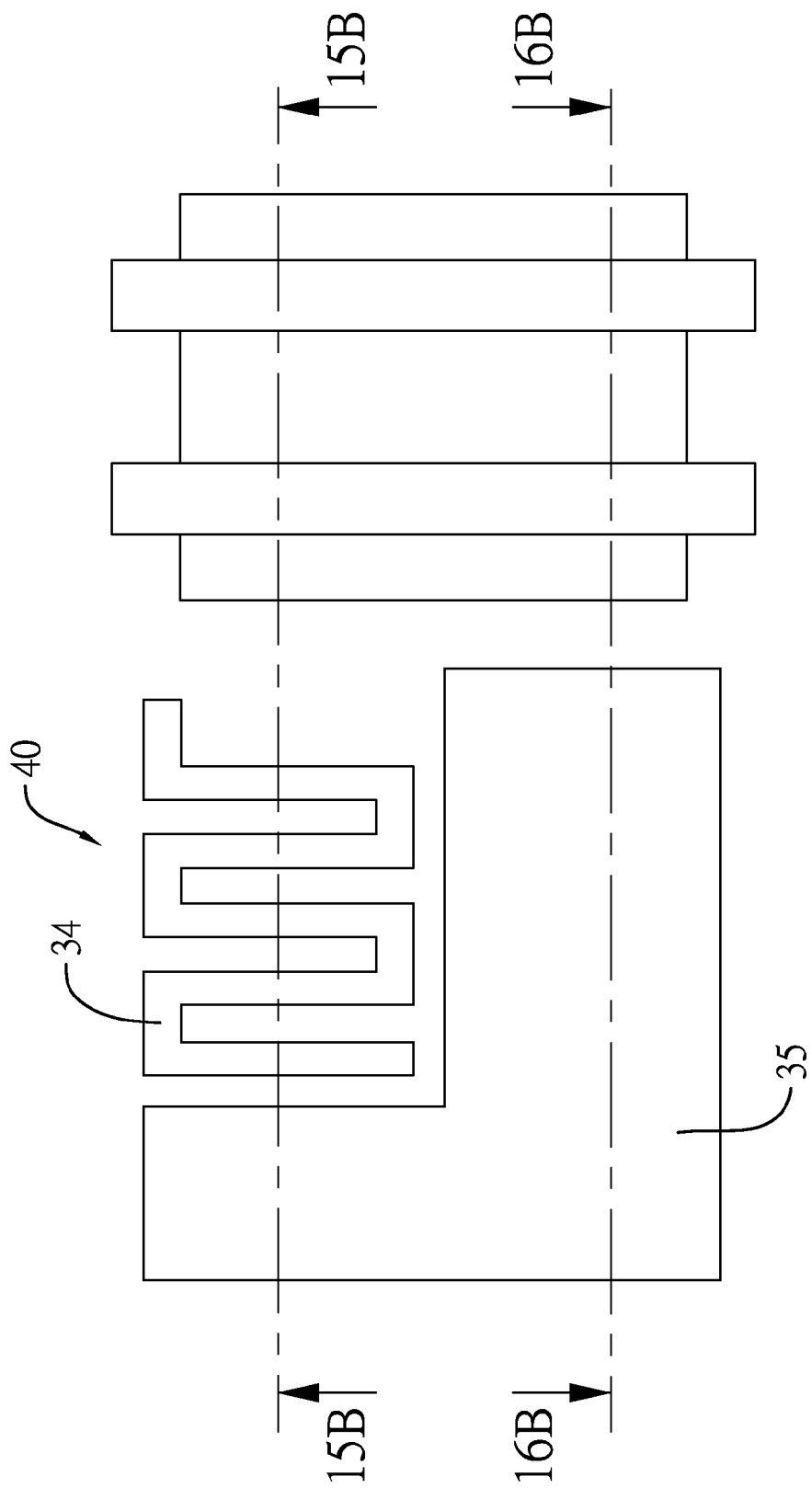

INTEGRATED CIRCUIT DEVICE AND ELECTROSTATIC DISCHARGE PROTECTION DEVICE THEREOF

BACKGROUND OF THE INVENTION

1. Field of the Invention

The present invention relates to an electrostatic discharge (ESD) protection device of an integrated circuit (IC) and, more particularly, to an IC device with ESD protection functionality provided by an ESD protection device.

2. Description of the Related Art

With reference to FIG. 17, a conventional integrated circuit (IC) has a power mesh 81 and a core 82. The power mesh includes multiple first electrodes 811 and a grounding electrode 812. The first electrodes 811 are arranged to take the form of a ring, and each first electrode 811 is mounted inside an installation area 813. The core 82 is located inside the grounding electrode 812, and is electrically connected to the first electrodes 811 and the grounding electrode 812. The first electrodes 811 and the grounding electrode 812 are connected to a power source to receive an operating voltage for the core 82 to operate.

Rapid development of semiconductor fabrication processes speeds up miniaturization of IC. For small-scale ICs, ESD protection has become an increasingly important function. To protect IC against the attack of ESD, conventional ICs require an additional ESD protection circuit to promptly guide static electricity to the grounding electrode 812 without reaching and damaging the core 82 when static electricity occurs on the first electrode 811. However, the conventional ESD protection circuit usually occupies a space of the IC and adds difficulty to miniaturization of the IC.

SUMMARY OF THE INVENTION

An objective of the present invention is to provide an electrostatic discharge (ESD) protection device of an integrated circuit (IC) and an IC device containing the ESD protection device that do not increase the overall size thereof and facilitate miniaturization of the IC and the IC device.

To achieve the foregoing objective, the ESD protection device of an IC, in which the IC has a substrate, a core and a power mesh, the power mesh has at least one power electrode, a grounding electrode and a seal ring, the core is formed on the substrate and is located inside the grounding electrode, and the power mesh is located between the grounding electrode and the seal ring, has multiple discharging units, multiple switch triggering units and multiple switching units.

The discharging units are formed on the substrate to correspond to a portion of the substrate covered by the power mesh. Each discharging unit is electrically connected between a corresponding power electrode and the grounding electrode or between a corresponding power electrode and the seal ring.

Each switch triggering unit is electrically connected between a corresponding power electrode and the grounding electrode or between a corresponding power electrode and the seal ring to detect occurrence of static electricity.

Each switching unit is electrically connected between a corresponding power electrode and the grounding electrode, and is electrically connected between a corresponding switch triggering unit and a corresponding discharging unit for the corresponding switch triggering unit to turn on the corresponding discharging unit upon detecting occurrence of static electricity.

To achieve the foregoing objective, the integrated circuit (IC) device has an IC and an electrostatic discharge (ESD) protection device.

The IC has a substrate, a power mesh and a core.

The power mesh has at least one power electrode, a grounding electrode and a seal ring.

The core is formed on the substrate and is located inside the grounding electrode The ESD protection device has multiple discharging units, multiple switch triggering units and multiple switching units.

The discharging units are formed on the substrate to correspond to a portion of the substrate covered by the power mesh. Each discharging unit is electrically connected between a corresponding power electrode and the grounding electrode or between a corresponding power electrode and the seal ring.

Each switch triggering unit is electrically connected between a corresponding power electrode and the grounding electrode or between a corresponding power electrode and the seal ring to detect occurrence of static electricity.

Each switching unit is electrically connected between a corresponding power electrode and the grounding electrode, and is electrically connected between a corresponding switch triggering unit and a corresponding discharging unit for the corresponding switch triggering unit to turn on the corresponding discharging unit upon detecting occurrence of static electricity.

Given the circuit design of the present invention, when ESD occurs at any place of the power mesh, a corresponding switch triggering unit detects the ESD occurrence and then drives a corresponding switching unit to turn on a corresponding discharging unit. Thus, energy of the static electricity from the power electrode can be guided into the ground through the corresponding discharging unit, thereby protecting the core of the IC against the damage of the static electricity. As the ESD protection device is formed on the substrate to correspond to a portion covered by the power mesh, the boundary of the power mesh is identical to that of the IC (or the seal ring). Accordingly, the present invention can effectively utilize the space of an IC without enlarging the overall size of the IC for adding the ESD protection circuit, and can achieve miniaturization of the IC.

Other objectives, advantages and novel features of the invention will become more apparent from the following detailed description when taken in conjunction with the accompanying drawings.

BRIEF DESCRIPTION OF THE DRAWINGS

FIG. 14 is a schematic plane view of a switch triggering unit in FIG. 13;

DETAILED DESCRIPTION OF THE INVENTION

Figure 1:
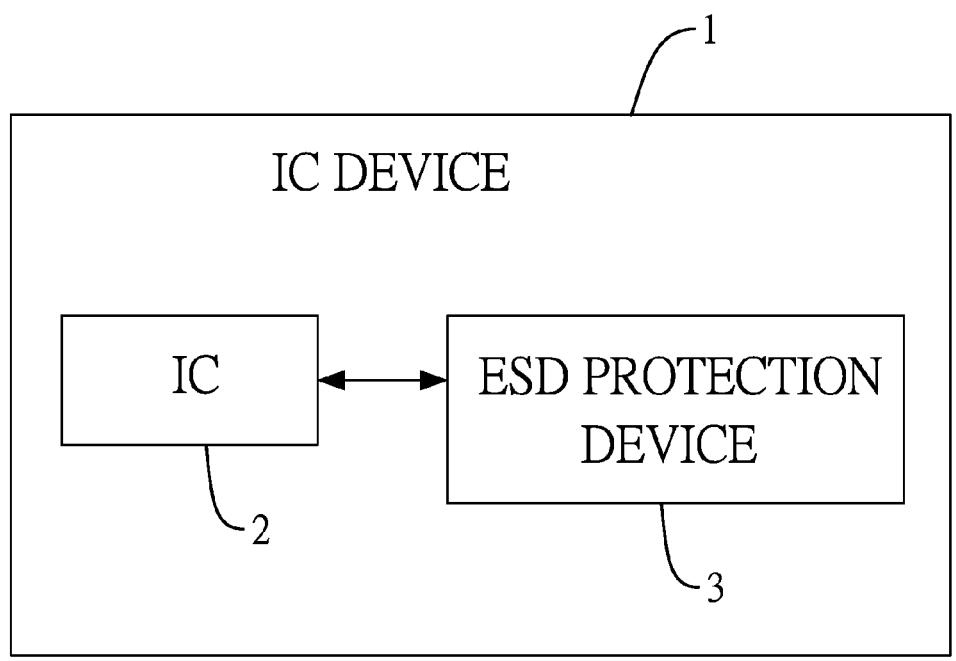
FIG. 1 is a functional block diagram of an IC device in accordance with the present invention.
Figure 2:
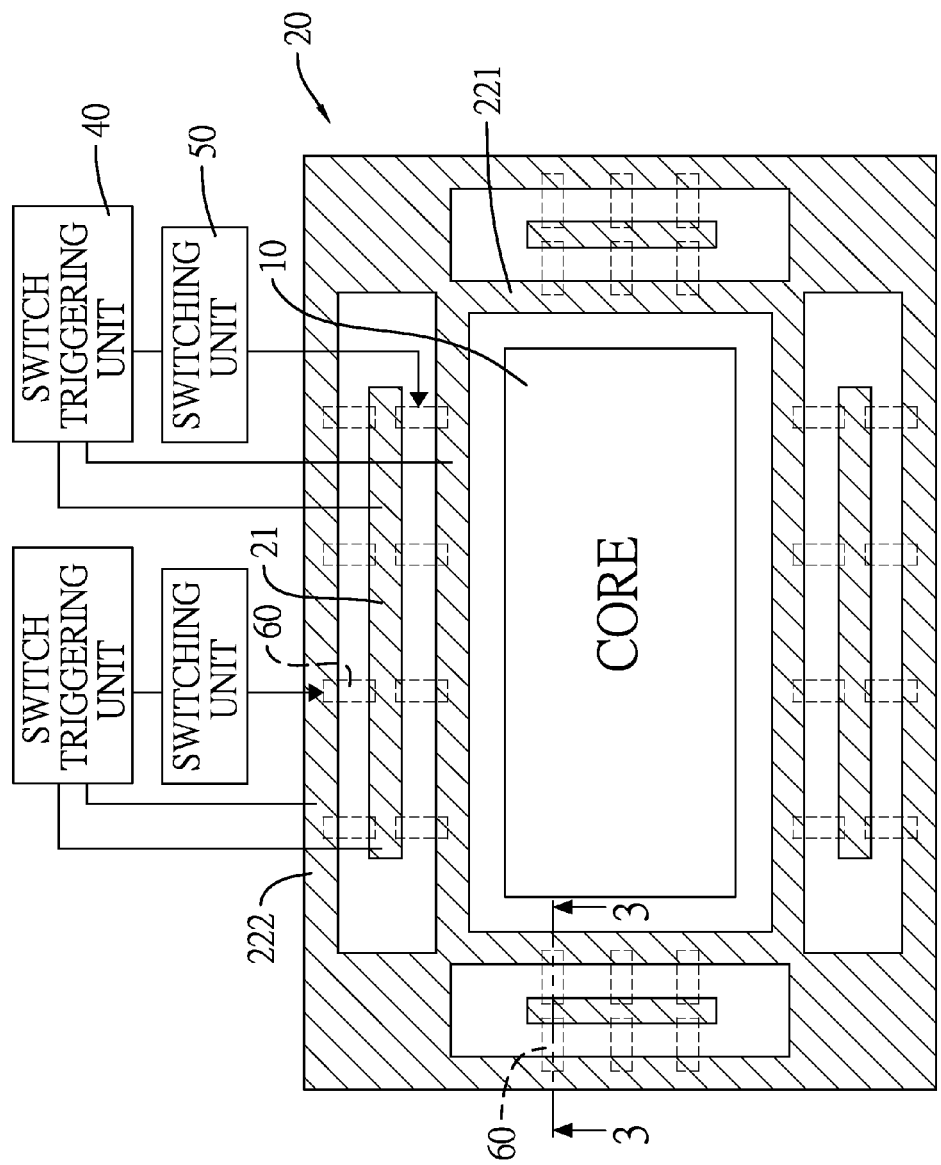
FIG. 2 is a schematic view showing a first embodiment of the IC device in FIG. 1 with an ESD protection device in connection with a power mesh of an IC.
Figure 3:
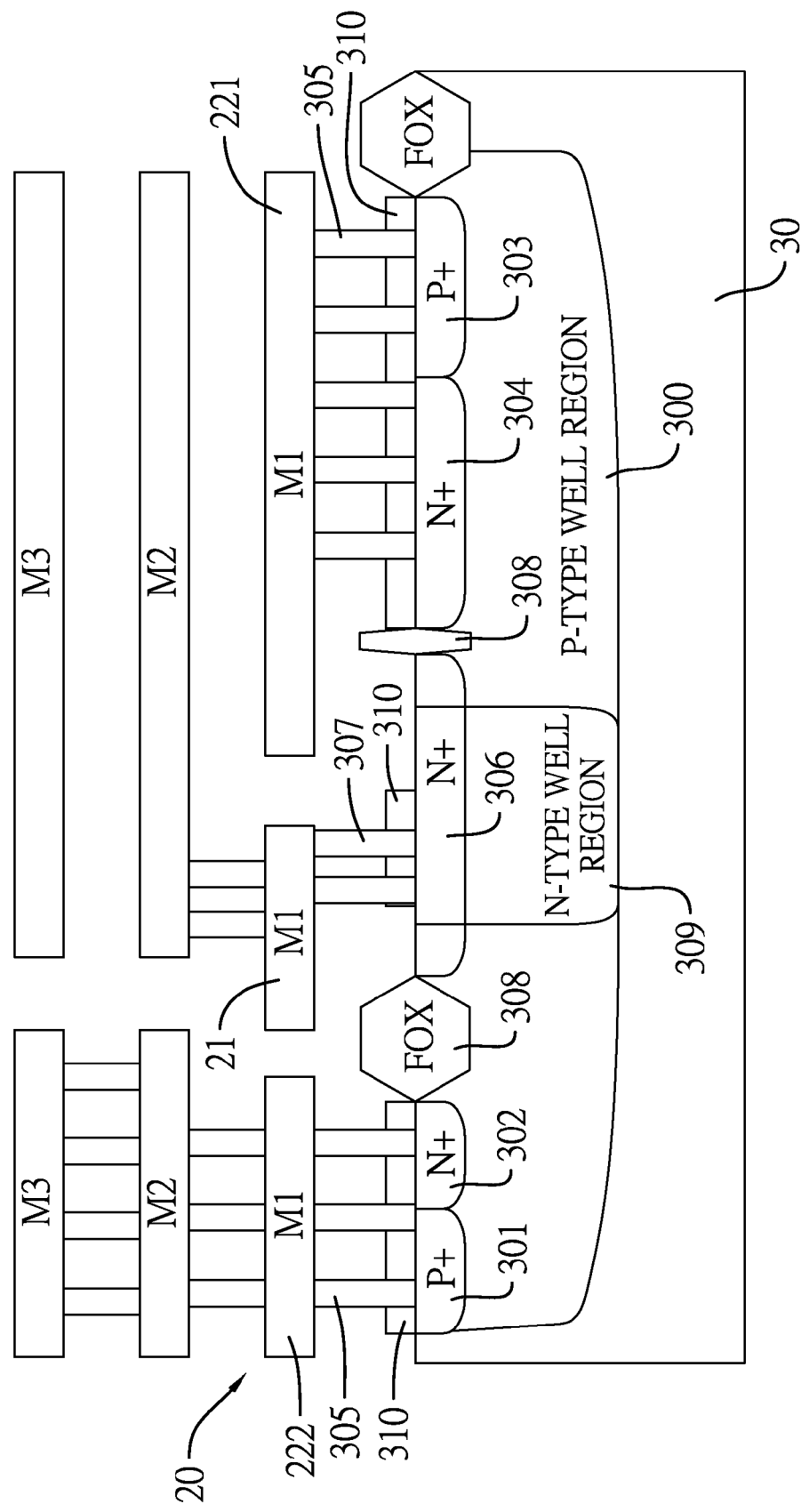
FIG. 3 is a partially enlarged cross-sectional side view taken along the line 3-3 of the power mesh and the ESD protection device in FIG. 2.

With reference to FIG. 1, an integrated circuit (IC) device 1 in accordance with the present invention has an IC 2 and an electrostatic (ESD) protection device 3. With reference to FIGS. 2 and 3, a first embodiment of an IC device in accordance with the present invention is shown. The IC 2 is a packaged element and includes a substrate 30, a core 10 and a power mesh 20. The power mesh 20 has at least one power electrode 21, a grounding electrode 221 and a seal ring 222. The seal ring 222 may take the form of a ring and is electrically conductive. The grounding electrode 221 is formed inside the seal ring 222, may take the form of a ring, and is electrically connected to the seal ring 222. The at least one power electrode 21 is formed between the seal ring 222 and the grounding electrode 221, and the at least one power electrode 21 is contactless with the seal ring 222 and the grounding electrode 221. The core 10 is formed on the substrate 30 and is located inside the grounding electrode 221. The at least one power electrode 21 is electrically connected to a power terminal (VDD) and the grounding electrode 221 is electrically connected to a ground terminal (GND). The core 10 is electrically connected to the at least one power electrode 21 and the grounding electrode 221 to receive an operating power for operation.

Figure 4:
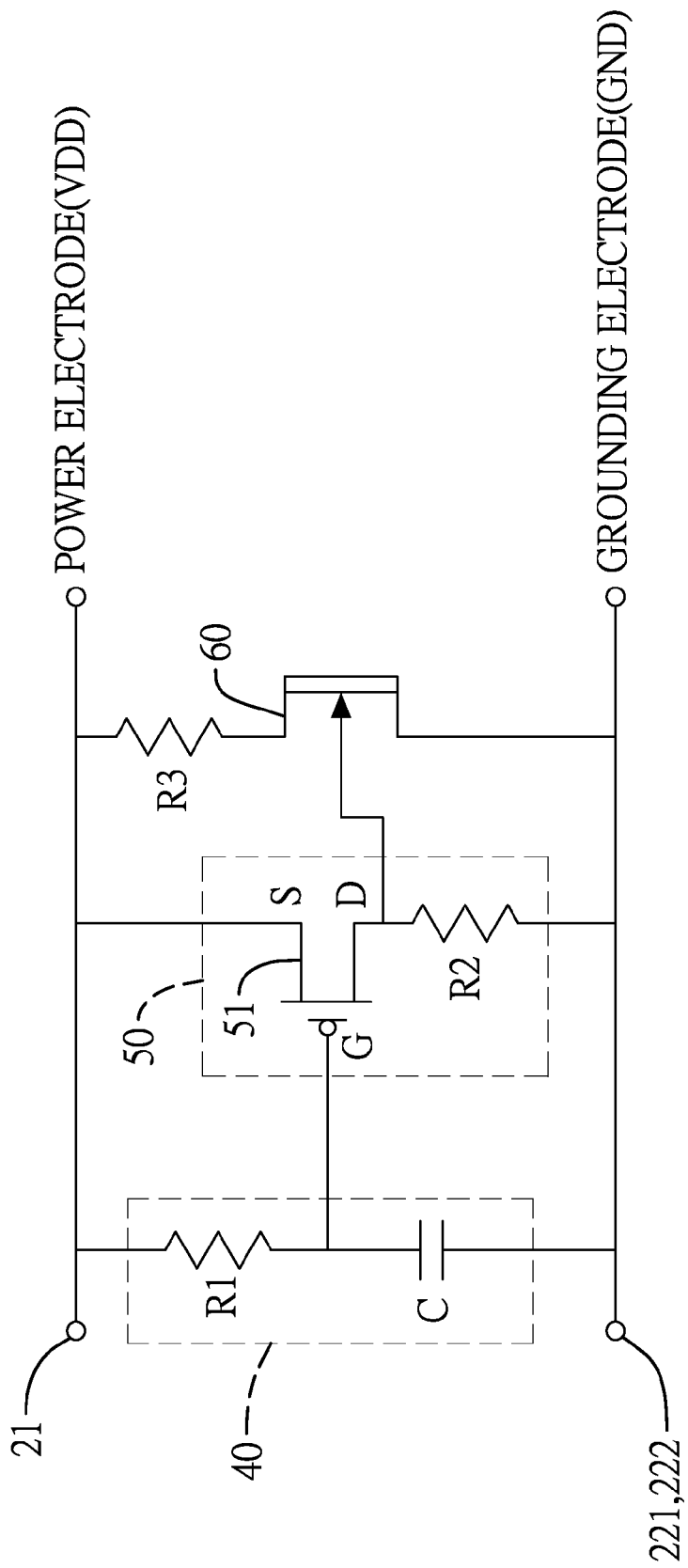
FIG. 4 is a circuit diagram showing an equivalent circuit of the ESD protection device in FIG. 2.

With reference to FIG. 4, the ESD protection device 3 has multiple discharging units 60, multiple switch triggering units 40 and multiple switching units 50. As shown in FIG. 2, the discharging units 60, the switch triggering units 40 and the switching units 50 are respectively and electrically connected between the at least one power electrode 21 and the grounding electrode 221 and between the at least one power electrode 21 and the seal ring 222. The switch triggering units 40 are connected to the respective switching units 50 to turn on or turn off the respective switching units 50. The switching units 50 are connected to the respective discharging units 60 to turn on or turn off the respective discharging units 60. In the present embodiment, the discharging units 60 and the core 10 are formed on the substrate 30.

With further reference to FIG. 3, the substrate 30 may be a p-type substrate, and includes a p-type well region 300. The p-type well region 300 corresponds to an area covered by the power mesh 20, and has a first p-type electrode region 301, a first n-type electrode region 302, a second p-type electrode region 303 and a second n-type electrode region 304. The first p-type electrode region 301, the first n-type electrode region 302, the second p-type electrode region 303 and the second n-type electrode region 304 are electrically connected to the grounding electrode 221 or the seal ring 222 of the power mesh 20. The p-type well region 300 further has a common n-type electrode region 306 that is electrically connected to the at least one power electrode 21 of the power mesh 20 through a via 307. The first p-type electrode region 301 and the first n-type electrode region 302 are formed next to each other. The second p-type electrode region 303 and the second n-type electrode region 304 are also formed next to each other. The common n-type electrode region 306 is located between the first n-type electrode region 302 and the second n-type electrode region 304 with two insulation layers 308 respectively sandwiched between the first n-type electrode region 302 and the common n-type electrode region 306 and between the second n-type electrode region 304 and the common n-type electrode region 306. The insulation layer is a field oxide (FOX) layer. The common n-type electrode region 306, the first p-type electrode region 301 and the first n-type electrode region 302 constitutes one of the discharging units 60 connected between a corresponding power electrode 21 and the seal ring 222. The common n-type electrode region 306, the second p-type electrode region 303 and the second n-type electrode region 304 constitutes another one of the discharging units 60 connected between a corresponding power electrode 21 and the grounding electrode 221. Each discharging unit may be an n-p-n based bipolar junction transistor (BJT).

The p-type well region 300 may have an n-type well region 309 located under the via 307 with a top portion of the n-type well region 309 connected to the common n-type electrode region 306. A bottom portion of the n-type well region 309 extends to a bottom portion of the substrate 30 and is located inside the p-type well region 300. A doped concentration of the common n-type electrode region 306 is greater than that of the n-type well region 309. Salicide layers 310 are formed on portions of a top surface of the substrate 30 that respectively correspond to the first p-type electrode region 301, the first n-type electrode region 302, the second p-type electrode region 303, the second n-type electrode region 304, and the common n-type electrode region 306, and serves as a conducting medium applied in connection with each via 305, 307 and one of the first p-type electrode region 301, the first n-type electrode region 302, the second p-type electrode region 303, the second n-type electrode region 304 to reduce conducting resistance. Each discharging unit 60 may be an n-p-n BJT, a p-n-p BJT or other type of transistor. Moreover, the power mesh 20 may be one of multiple conducting layers M1 in the IC. As shown in FIG. 3, other conducting layers M2, M3 formed in the IC based on a power demand of the core 10 can serve as voltage sources with different voltage values.

With further reference to FIG. 4, each switch triggering unit 40 has a first resistor R1 and a capacitor C. The first resistor R1 and the capacitor C are connected in series and are electrically connected between the power electrode 21 and the grounding electrode 221. The switching unit 50 has an electronic switch 51 and a second resistor R2. The electronic switch 50 has a first terminal, a second terminal and a control terminal. The electronic switch 50 includes, but is not limited to a p-type metal oxide semiconductor field effect transistor (p-MOSFET). Given the p-MOSFET as an example for the electronic switch 51, the control terminal is a gate G of the p-MOSFET that is electrically connected to a series-connected node between the first resistor R1 and the capacitor C. The first terminal is a source of the p-MOSFET that is electrically connected to a corresponding power electrode 21. The second terminal is a drain of the p-MOSFET that is connected to the ground through the second resistor R2, and is connected in series with the second resistor R2. A series-connected node between the second terminal and the second resistor R2 is electrically connected to a control terminal of a corresponding discharging unit 60 that is a gate of a field effect transistor (FET) or a base of a bipolar junction transistor (BJT). With further reference to FIG. 3, the n-type well region 309 is equivalent to a parasitic resistor R3 connected in series with a corresponding discharging unit 60.

When the power mesh 20 stably supplies power, the capacitor C of the switch triggering unit 40 acts like an open circuit, such that the gate voltage of the electronic switch 51 is at a high level and the electronic switch shuts off. Thus, the discharging unit 60 is not turned on, and no short circuit is formed between the power electrode 21 and the grounding electrode 221 or between the power electrode 21 and the seal ring 222. When there is a transient voltage arising from electrostatic discharge of the power electrode 21 of the power mesh 20, the capacitor acts like a short circuit because the transient voltage is an AC (Alternating Current) signal. Therefore, the gate voltage of the electronic switch 51 stays at a low level and the electronic switch 51 thus turns on. After the electronic switch 51 turns on, a voltage at the series-connected node between the drain of the electronic switch 51 and the second resistor R2 turns on the discharging unit 60. When the discharging unit 60 is turned on, the parasitic resistor R3 can limit current and suppress energy of the discharged static electricity in an electrostatic discharge region before the static electricity is grounded through the discharging unit 60 to prevent the discharging unit 60 form being directly damaged by the static electricity. Accordingly, the discharged static electricity can be grounded through the grounding electrode 221 or the seal ring 222 without reaching and damaging the core 10 of the IC.

Figure 5:
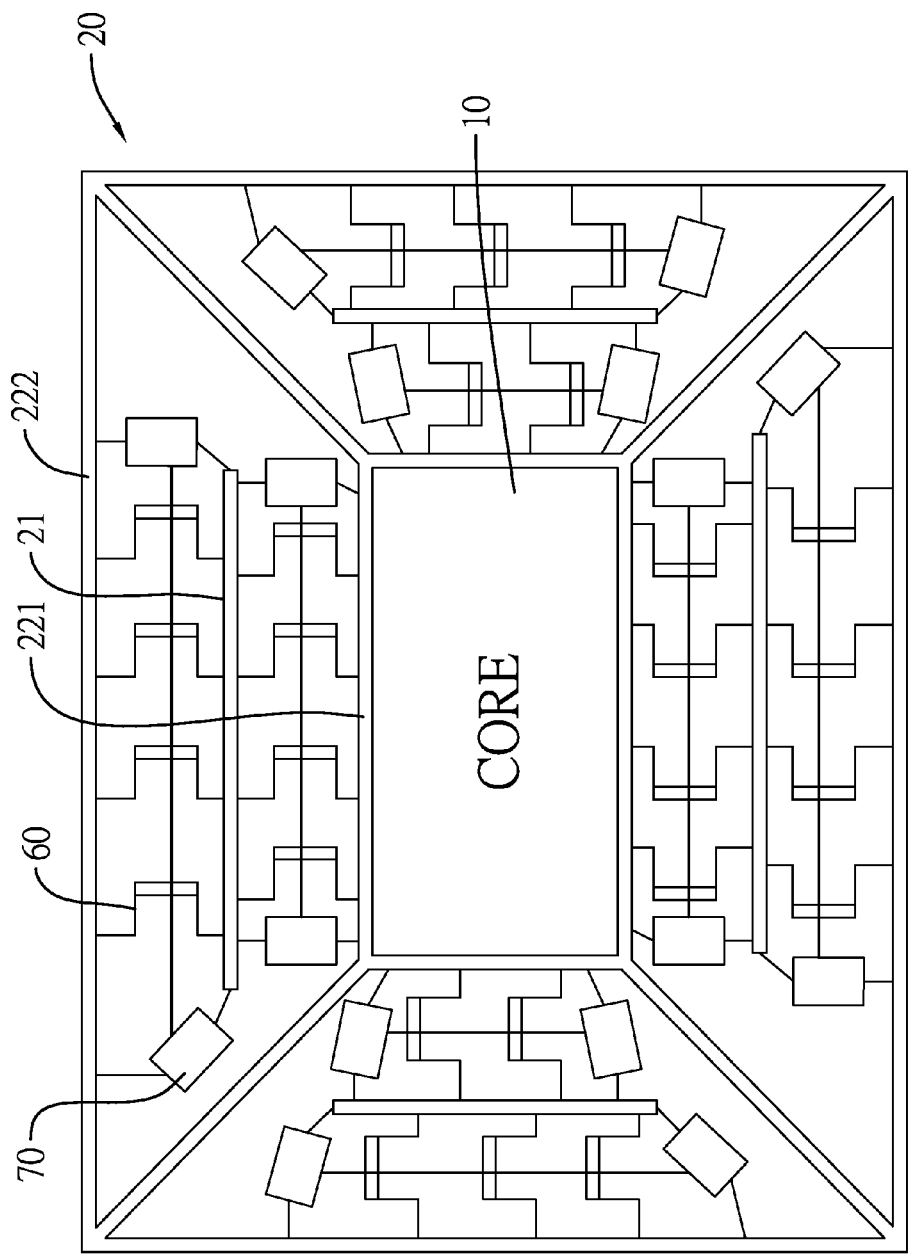
FIG. 5 is a schematic diagram showing a layout of discharge units and driving circuit units of the ESD protection device in FIG. 2.

As the discharging units 60 are formed on the substrate 30 of the IC 2, there are grounding points, power points and control points formed on a surface of the IC 2. The grounding points are electrically connected to the grounding electrode 221. The power points are electrically connected to the power electrode 21. The control points are electrically connected to the control terminals of the discharging units 60. With reference to FIG. 5, each switch triggering unit and a corresponding switching unit constitute a driving circuit unit 70 that is formed on an outer portion of the IC and is electrically connected to the grounding points, the power points and the control points. The power mesh 20 is rectangular and has two sides. The power electrode 21, the grounding electrode 221 and the seal ring 222 adjacent to each side of the power mesh 20 are connected to corresponding discharging units 60 and driving circuit units 70. As such, no matter where static electricity takes place in the power mesh 20, the corresponding driving circuit units 70 can immediately turn on the corresponding discharging units 60 to shunt the energy of the static electricity to the ground for complete ESD protection to the core 10.

Figure 6:
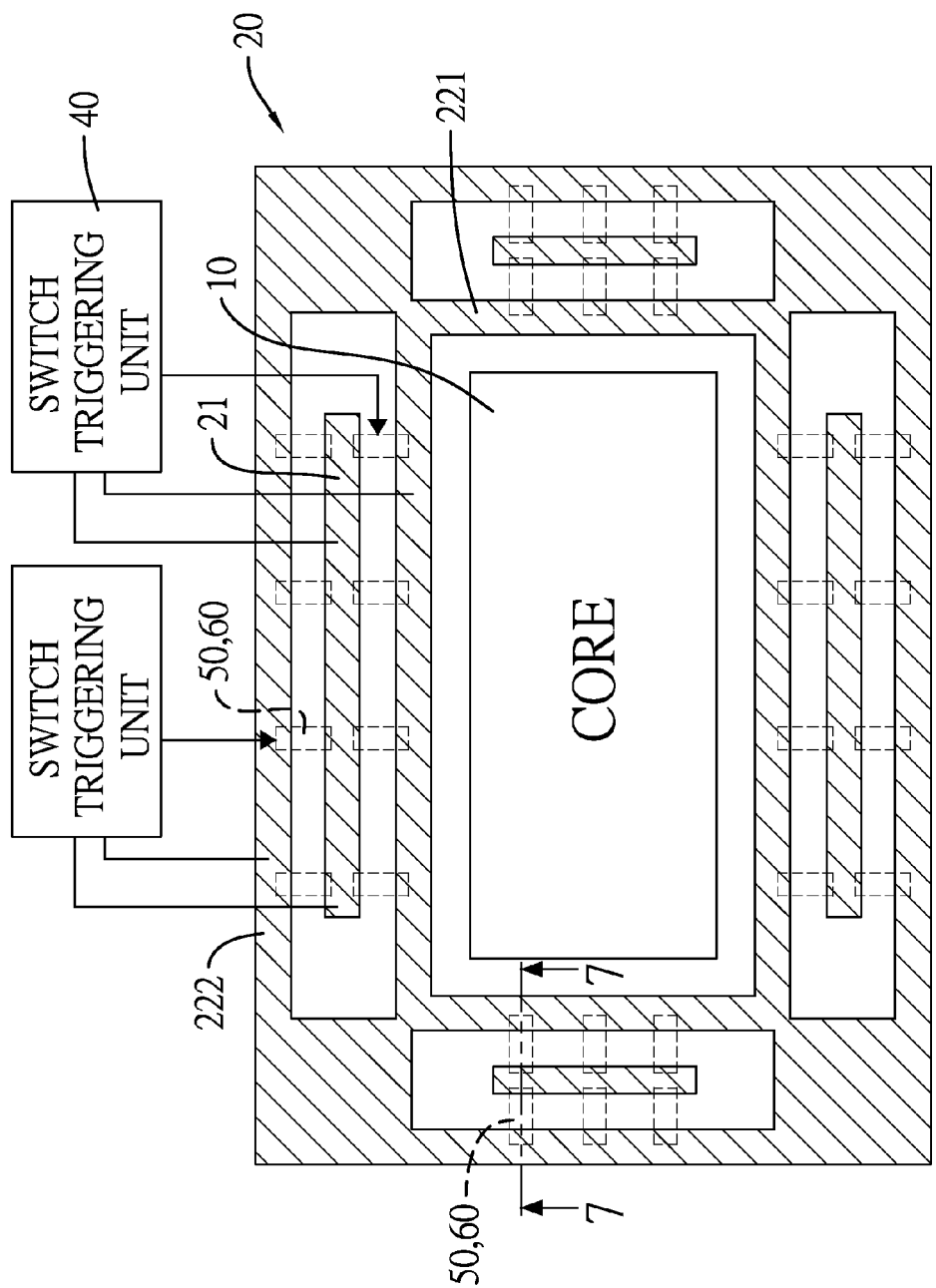
FIG. 6 is a schematic view showing a second embodiment of the IC device in FIG. 1 with an ESD protection device in connection with a power mesh of an IC.
Figure 7:
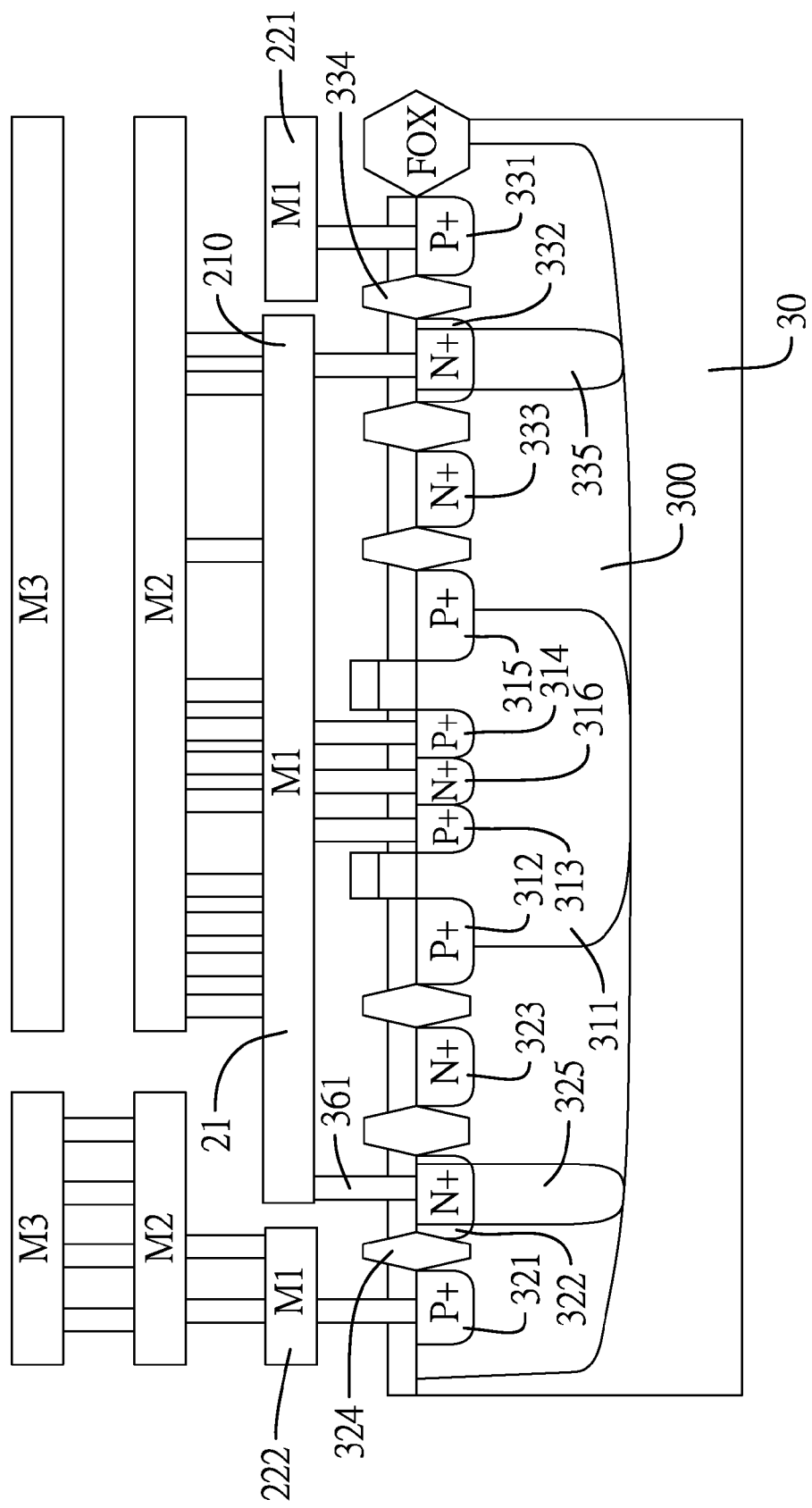
FIG. 7 is a partially enlarged cross-sectional side view taken along the line 7-7 of the power mesh and the ESD protection device in FIG. 6.

With reference to FIGS. 6 and 7, a second embodiment of an IC device in accordance with the present invention differs from the foregoing embodiment in that the switching units 50 and the discharging units 60 are formed on the substrate 30 to correspond to a portion of the substrate 30 covered by the power mesh 20, and the switch triggering units 40 are formed outside the IC 2 and are electrically connected to the grounding points, the power points and the control points formed on the surface of the IC 2. The p-type well region 300 has a first n-type well region 311. The first n-type well region 311 has a first p-type electrode region 312, a second p-type electrode region 313, a third p-type electrode region 314, a fourth p-type electrode region 315, and a common n-type electrode region 316. The first p-type electrode region 312, the second p-type electrode region 313 and the common n-type electrode region 316 constitute the electronic switch 51 of one of the switching units 50 connected between a corresponding power electrode 21 and the seal ring 222. The control terminal of the electronic switch 51 is connected to the control point on the surface of the IC 2. The third p-type electrode region 314, the fourth p-type electrode region 315, and the common n-type electrode region 316 constitute the electronic switch 51 of another one of the switching units 50 connected between the corresponding power electrode 21 and the grounding electrode 221.

Each discharging unit 60 connected between a corresponding power electrode 21 and the seal ring 222, and has a p-type electrode region 321, a first n-type electrode region 322, and a second n-type electrode region 323 formed inside the p-type well region 300 to constitute the discharging unit, which is an n-p-n based BJT. Two insulation layers 324 are respectively sandwiched between the p-type electrode region 321 and the first n-type electrode region 322 and between the first n-type electrode region 322 and the second n-type electrode region 323. The p-type electrode region 321 and the second p-type electrode region 312 constitute the second resistor R2, which is a parasitic resistor. The p-type well region 300 further has a second n-type well region 325. A top of the second n-type well region 325 is connected with the first n-type electrode region 322 and is located beneath a via 361. A bottom of the second n-type well region 325 extends to a bottom of the substrate 30 and is located inside the p-type well region 300. A doped concentration of the first n-type electrode region 322 is greater than that of the second n-type well region 325. Likewise, the second n-type well region 325 is taken as the parasitic resistor R3 for energy suppression of the discharged static electricity.

Similarly, each discharging unit 60 between a corresponding power electrode 21 and the grounding electrode 221 has a p-type electrode region 331, a first n-type electrode region 332, and a second n-type electrode region 333 formed inside the p-type well region 300 to constitute the discharging unit 60, which is a n-p-n based BJT. Two insulation layers 334 are respectively sandwiched between the p-type electrode region 331 and the first n-type electrode region 332 and between the first n-type electrode region 332 and the second n-type electrode region 333. The p-type electrode region 331 and the fourth p-type electrode region 315 constitute the second resistor R2, which is a parasitic resistor. The p-type well region 300 further has a third n-type well region 335. A top of the third n-type well region 335 is connected with the first n-type electrode region 332 and is located beneath a via. A bottom of the third n-type well region 335 extends to a bottom of the substrate 30 and is located inside the p-type well region 300. A doped concentration of the first n-type electrode region 332 is greater than that of the third n-type well region 335. Likewise, the third n-type well region 335 is taken as the parasitic resistor R3 for energy suppression of the discharged static electricity.

Figure 8:
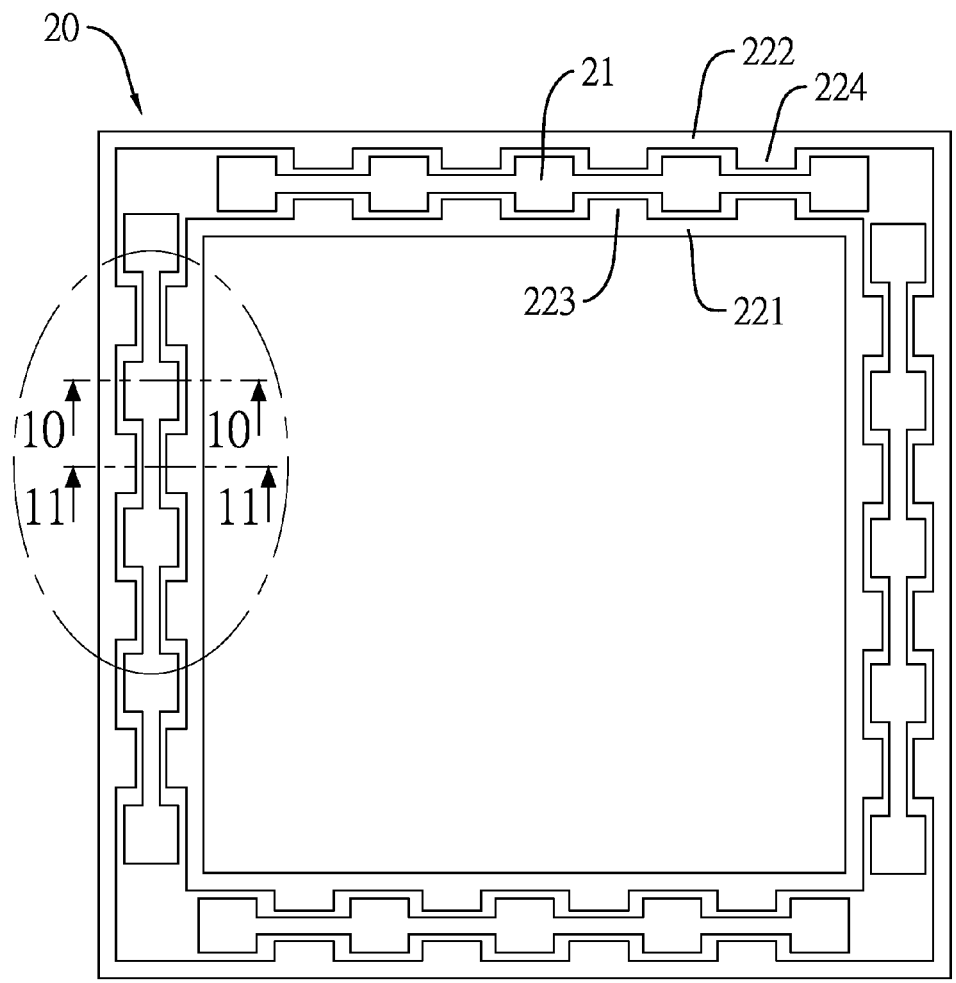
FIG. 8 is a schematic top view of the power electrode and the grounding electrode of the power mesh in FIG. 6.
Figure 9:
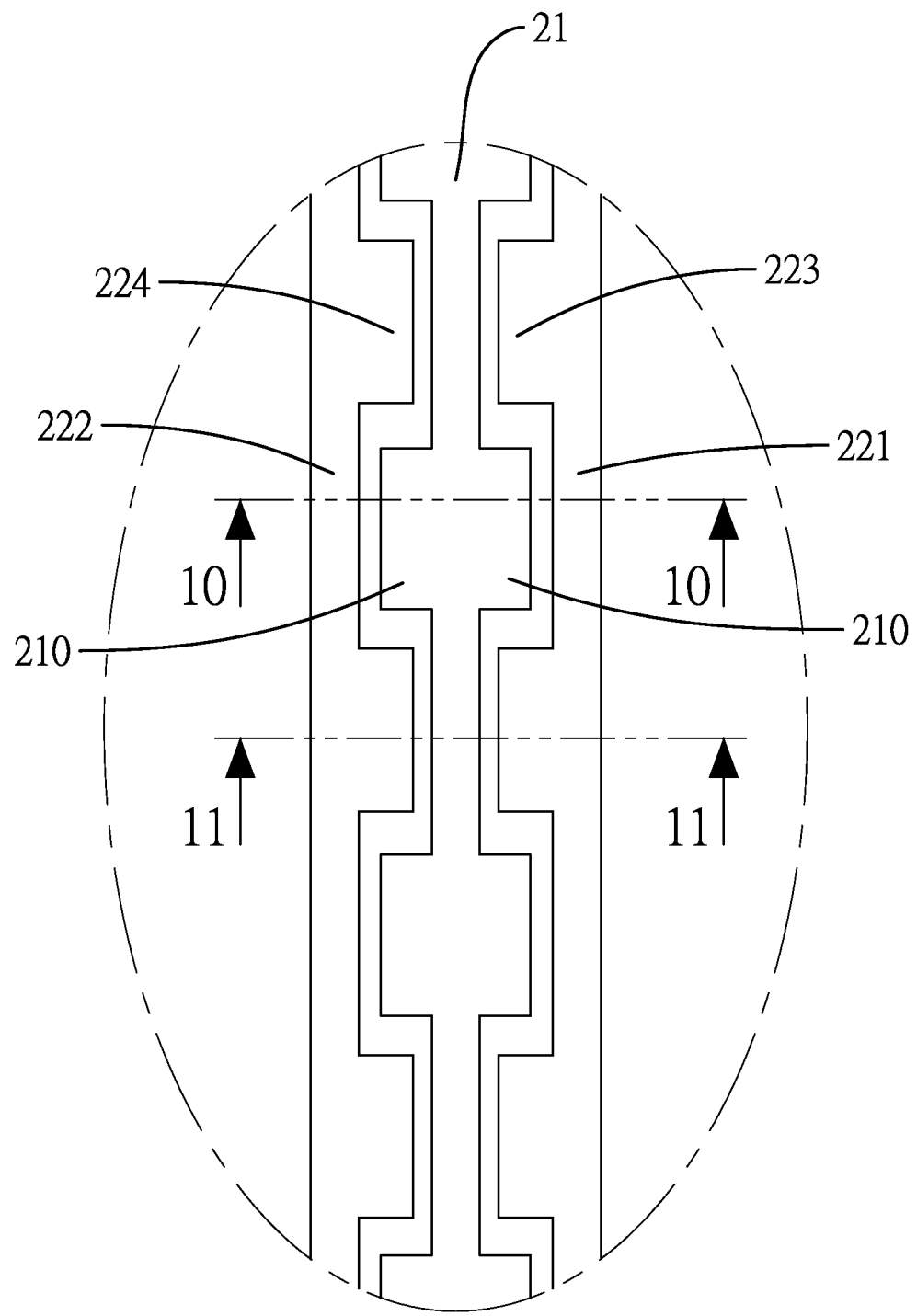
FIG. 9 is an enlarged schematic top view of the power electrode and the grounding electrode of the power mesh in FIG. 8.

To allow the discharging units 60 formed on the substrate 30 to be connected to the corresponding power electrode 21, the grounding electrode 221 and the seal ring 222 through vertical vias instead of through a winding and complicated via layout, with reference to FIGS. 8 and 9, the grounding electrode 221 of the power mesh 20 has multiple extended portions 223 alternately formed on an outer edge of the grounding electrode 221, the seal ring 222 also has multiple extended portions 224 alternately formed on an inner edge of the seal ring 222 and aligning with the respective extended portions 223 of the grounding electrode 221, and each one of the at least one power electrode 21 has multiple extended portions respectively formed on two opposite edges in a longitudinal direction, such that each extended portion on each of the two opposite edges of each one of the at least one power electrode 21 can be inserted into an indentation between two adjacent extended portions of the grounding electrode 221 or between the seal ring 222. In other words, each extended portion 223 of the grounding electrode 221 is inserted into an indentation between two adjacent extended portions 210 on an adjacent edge of a corresponding power electrode 21, and each extended portion 224 of the seal ring 222 is inserted into an indentation between two adjacent extended portions 210 on an adjacent edge of a corresponding power electrode 21.

Figure 10:
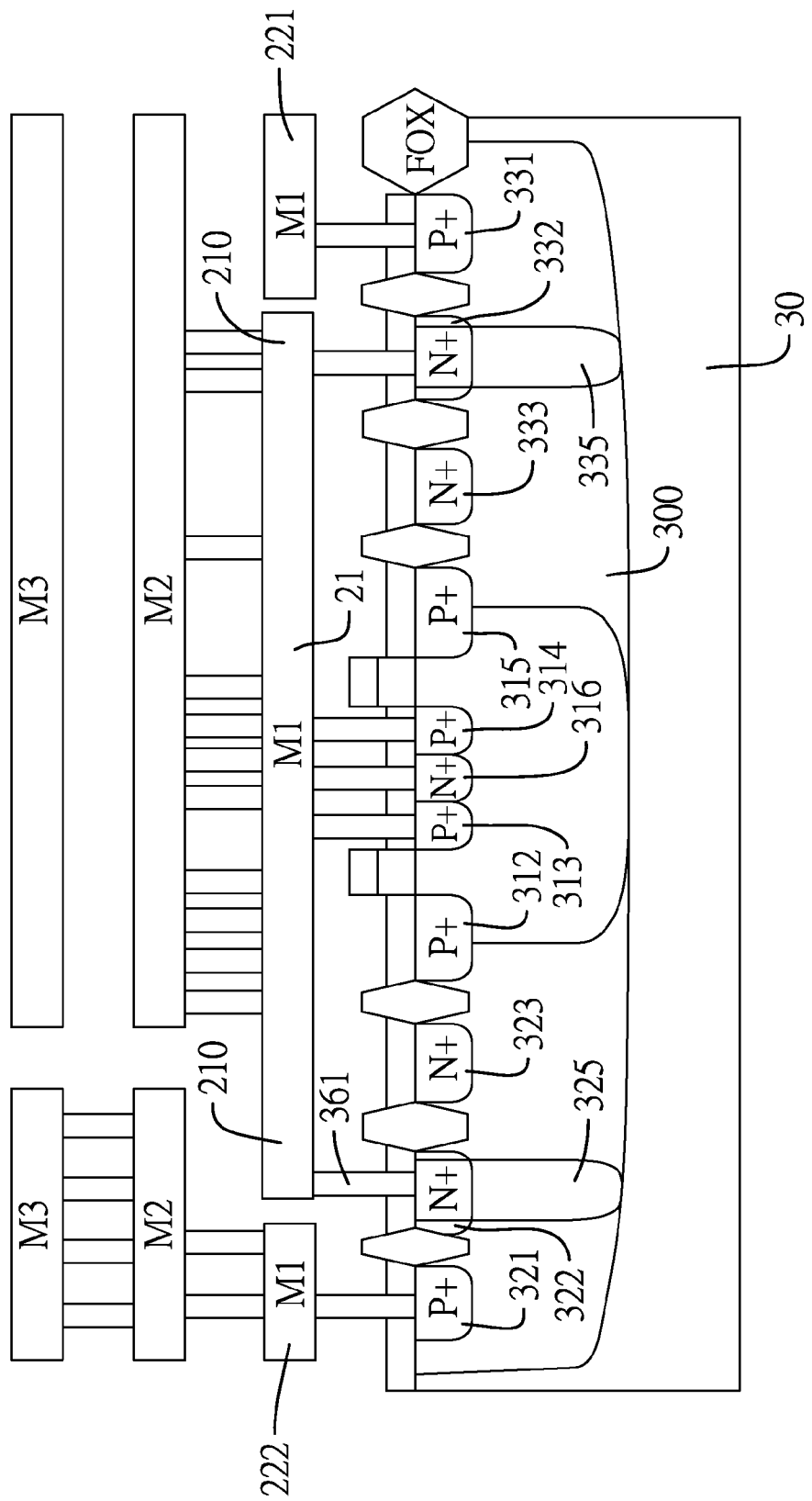
FIG. 10 is a partially enlarged cross-sectional side view taken along the line 10-10 of the power electrode and the grounding electrode in FIG. 9.
Figure 11:
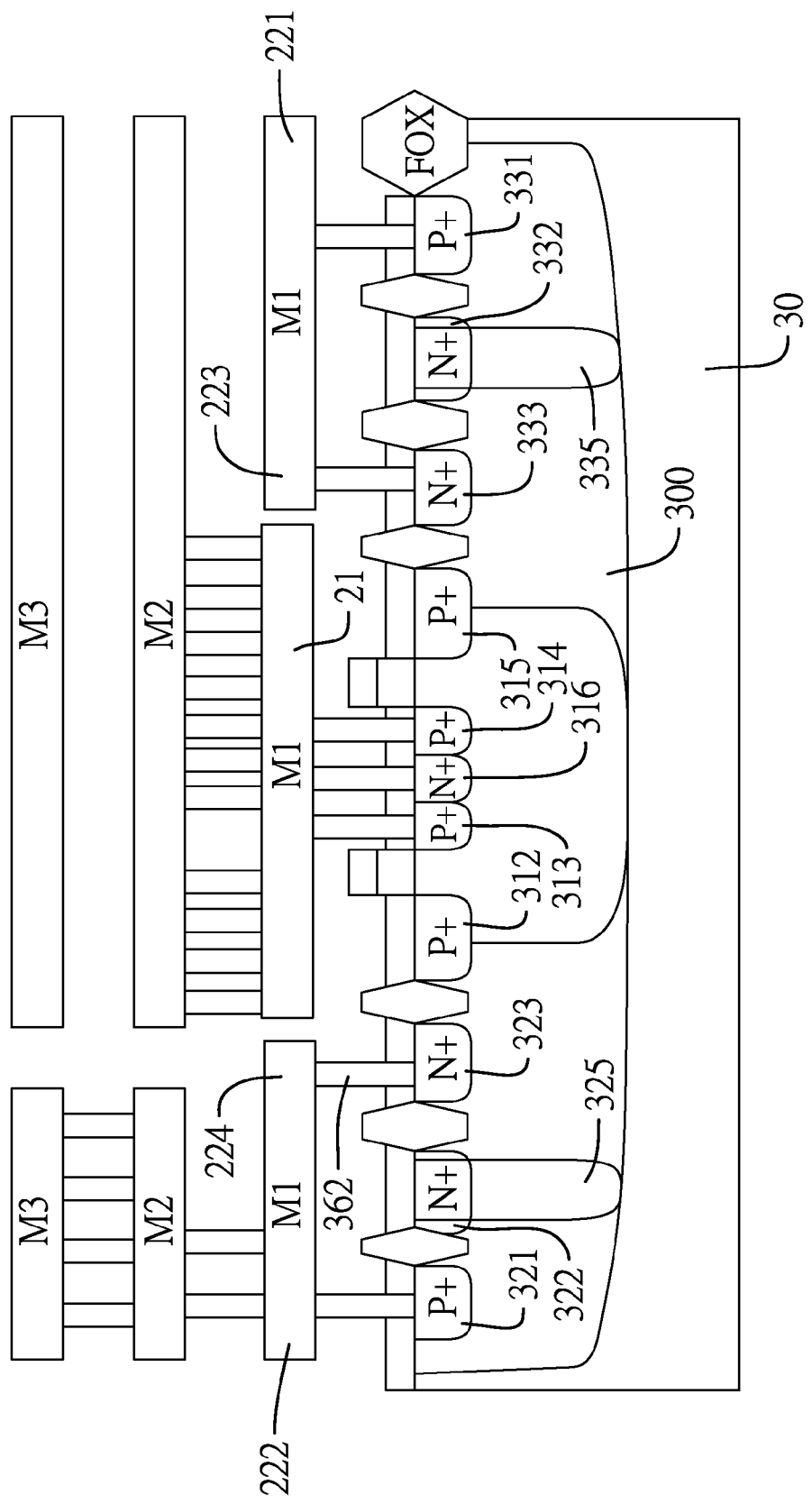
FIG. 11 is a partially enlarged cross-sectional side view taken along the line 11-11 of the power electrode and the grounding electrode in FIG. 9.
Figure 12:
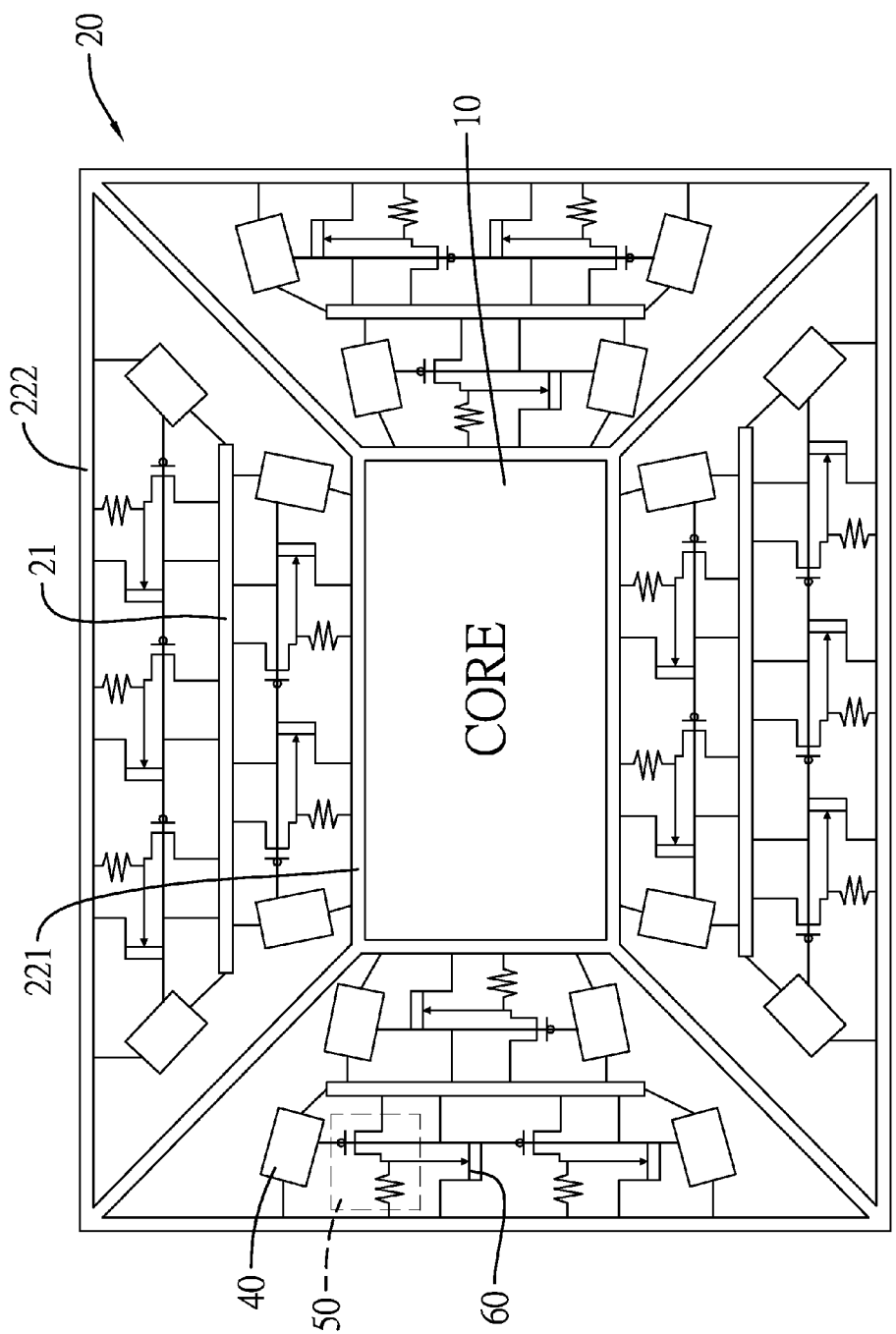
FIG. 12 is a schematic diagram showing a layout of discharge units and switch triggering units and switching units of the ESD protection device in FIG. 6.

With reference to FIGS. 4 and 10, given the discharging units 60 connected between a corresponding power electrode 21 and the seal ring 22 as an example for the following description, the first n-type electrode region 322 is located beneath a corresponding extended portion 210 of a corresponding power electrode 21, and the first n-type electrode region 322 is connected to the extended portion 210 of the power electrode 21 through a via 362. With reference to FIG. 11, the second n-type electrode region 323 is located beneath a corresponding extended portion 224 of the seal ring 222, such that the second n-type electrode region 323 is connected to the extended portion 224 of the seal ring 222 through another via 362. The rest of discharging units connected between the at least one power electrode 21 and the grounding electrode 221 can be deduced by analogy. Hence, each discharging unit 60 can be connected to a corresponding power electrode 21, the grounding electrode 221 or the seal ring 222 through a via 361, 362 by means of the structure of the extended portions of the at least one power electrode 21, the grounding electrode 221 and the seal ring 222. With reference to FIG. 12, in the present embodiment, the discharging units 60 and the switching units 50 are formed on the substrate to provide the core 10 a complete ESD protection.

Figure 13:
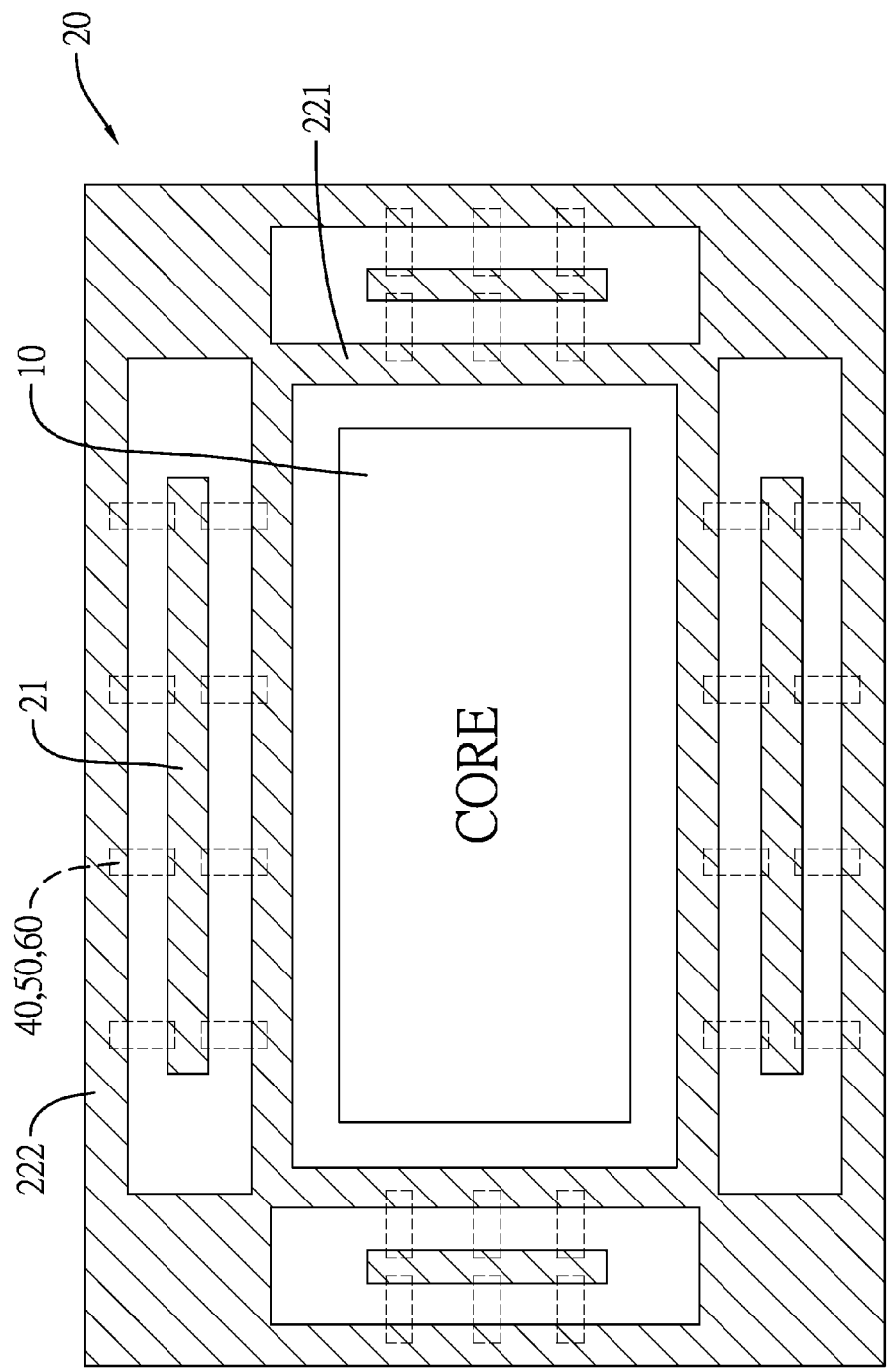
FIG. 13 is a schematic view showing a third embodiment of the IC device in FIG. 1 with an ESD protection device in connection with a power mesh of an IC.
Figure 15A:
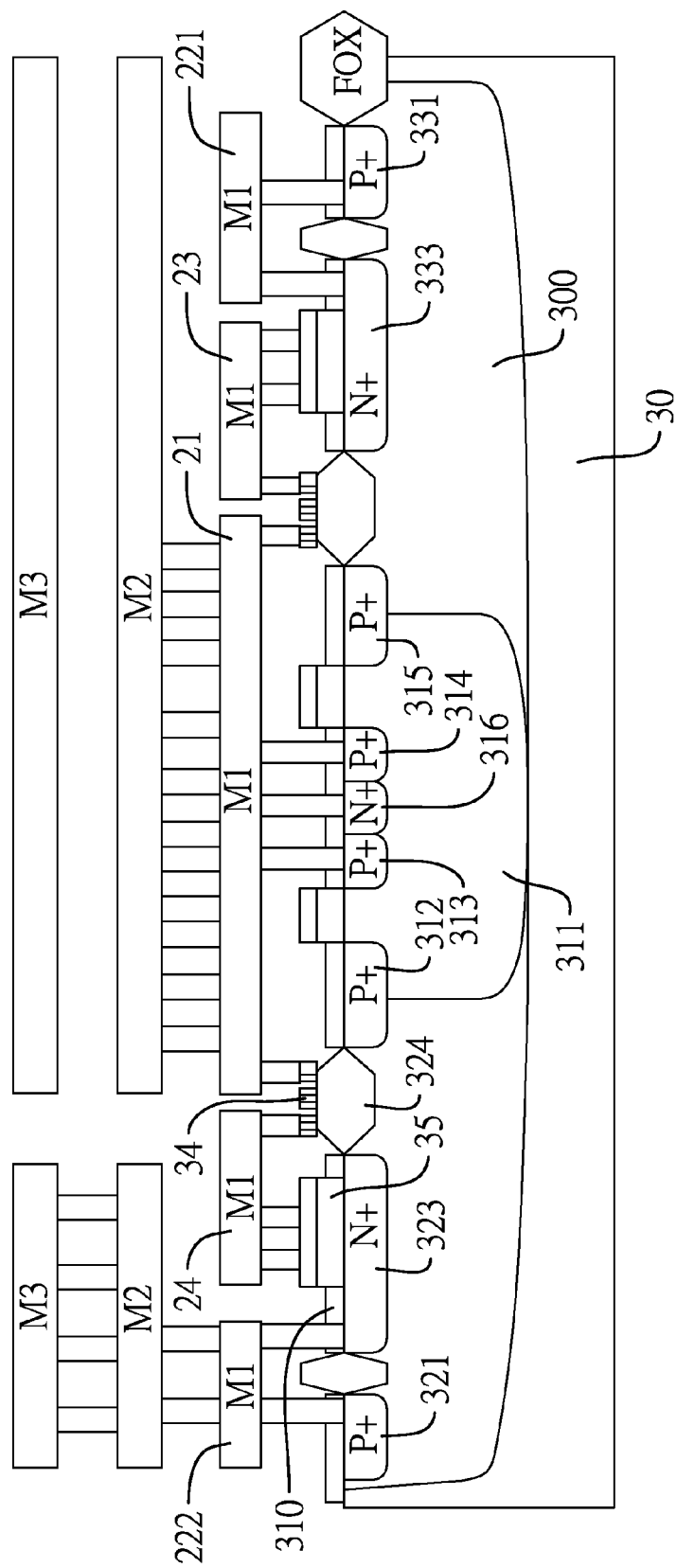
FIG. 15A is a cross-sectional view of the third embodiment of the IC device in FIG. 1.
Figure 15B:
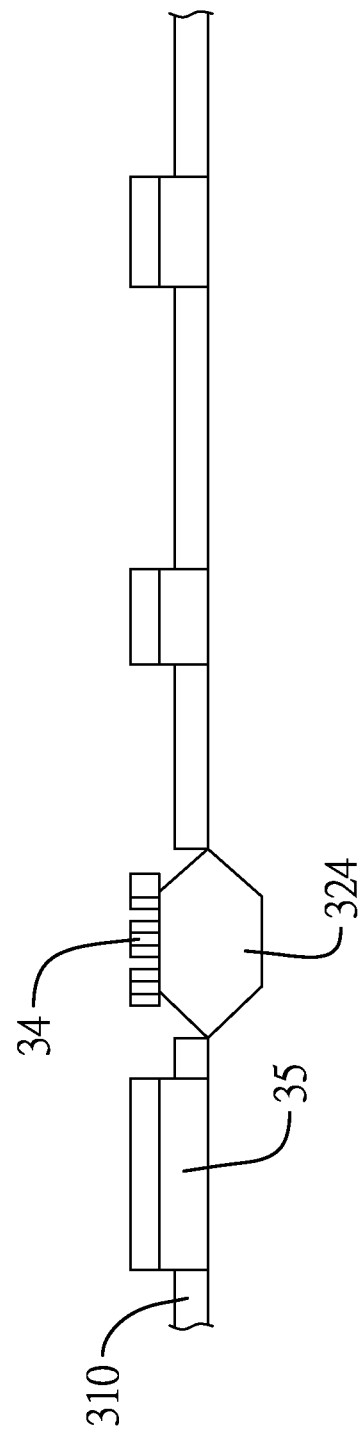
FIG. 15B is a cross-sectional side view taken along the line 15B-15B of the switching triggering unit in FIG. 14.
Figure 16A:
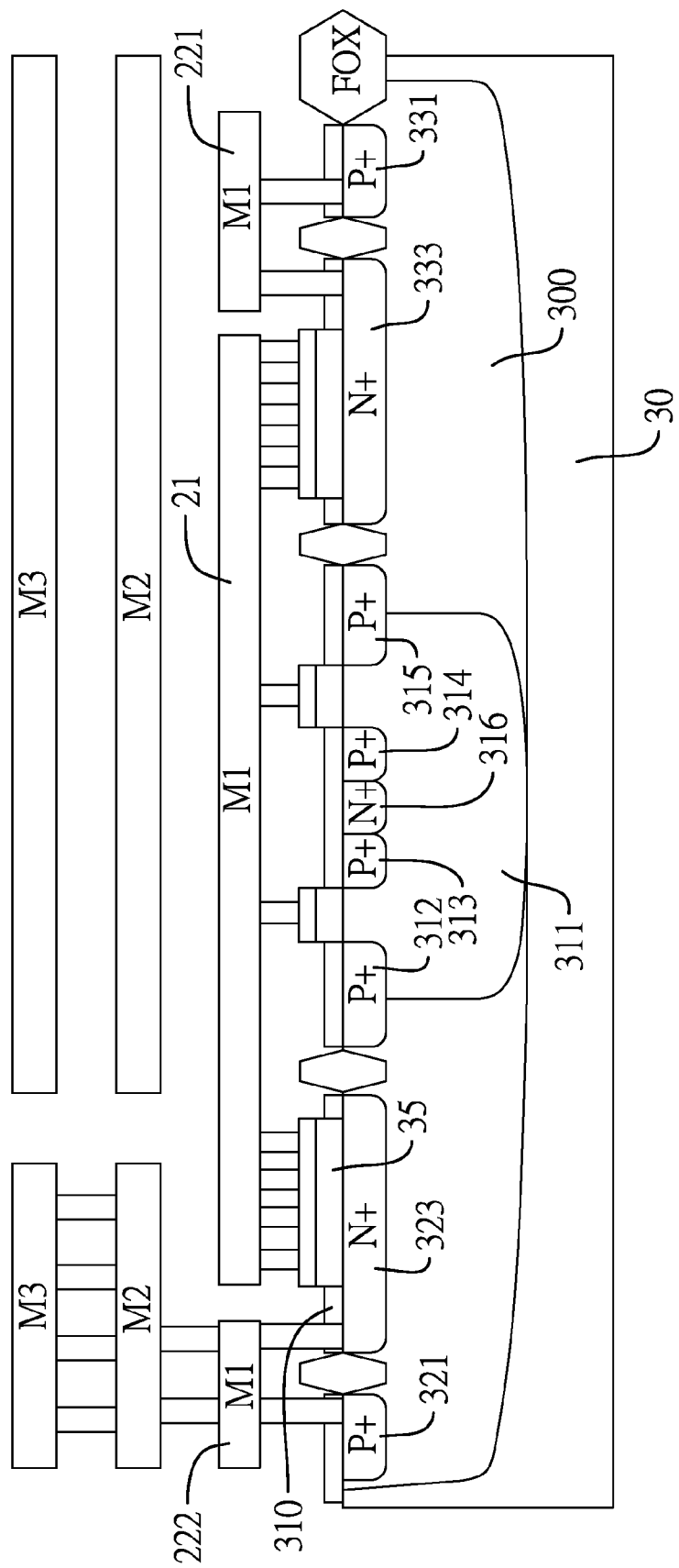
FIG. 16A is another cross-sectional view of the third embodiment of the IC device in FIG. 1.
Figure 16B:
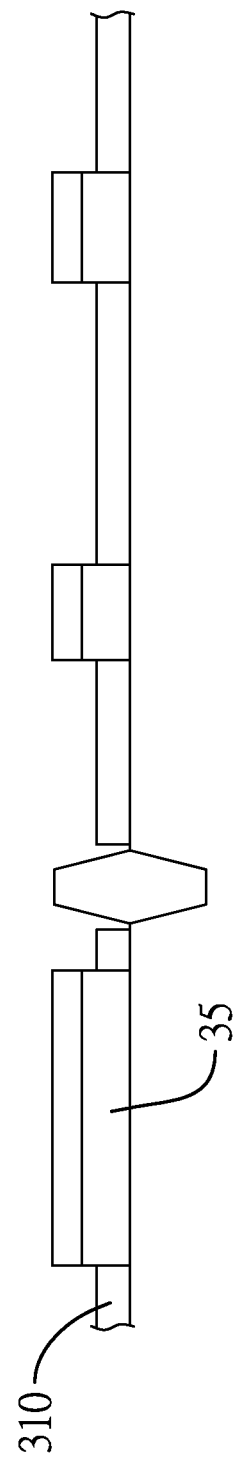
FIG. 16B is a cross-sectional side view taken along the line 16B-16B of the switching triggering unit in FIG. 14.
Figure 17:
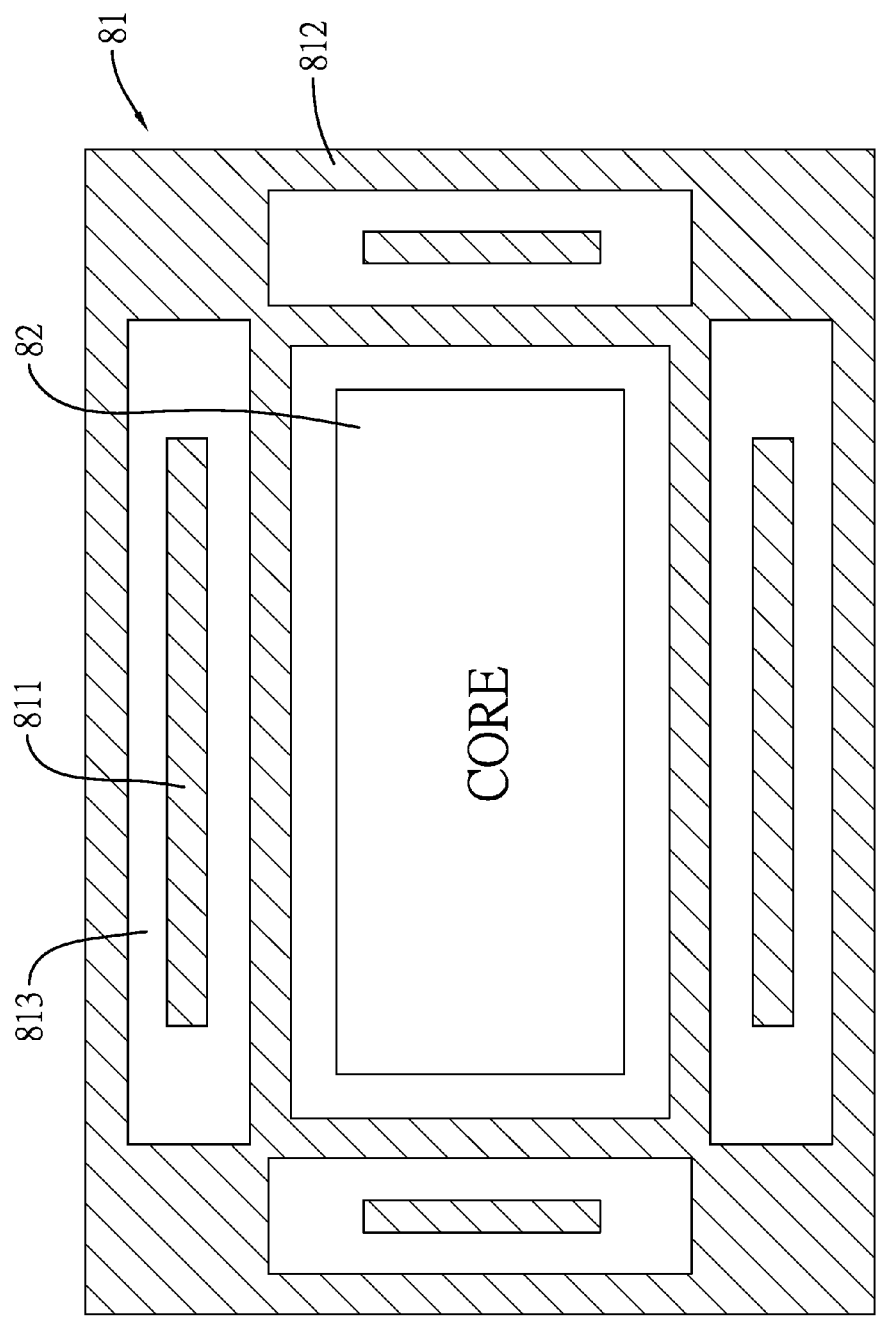
FIG. 17 is a schematic diagram showing a layout of a conventional IC having a power mesh and a core.

With reference to FIG. 13, a third embodiment of an IC device in accordance with the present invention is shown. The switch triggering units 40, the switching units 50 and the discharging units 60 are formed on the substrate 30 to correspond to a portion of the substrate covered by the power mesh 20. With reference to FIGS. 4, 14, 15A and 15B, the first resistor R1 of each switch triggering unit 40 is formed by a resistive layer 34. The resistive layer 34 is formed on the insulation layer 324 beside the first p-type electrode region 312, and takes the form of being repeatedly bent in opposite directions. In a distribution region of the resistive layer 34, the power mesh 20 has an inner auxiliary conducting layer 23 and an outer auxiliary conducting layer 24. The inner auxiliary conducting layer 23 is located between a corresponding power electrode 21 and the grounding electrode 221. The outer auxiliary conducting layer 24 is located between a corresponding power electrode 21 and the seal ring 222. Given the outer auxiliary conducting layer 24 as an example, the corresponding power electrode 21 is connected to one end of the resistive layer 34 through a via, and the outer auxiliary conducting layer 24 is connected to another end of the resistive layer 34. With reference to FIGS. 4, 14, 16A and 16B, the capacitor C of each switching unit 40 is formed by a capacitive layer 35. The capacitive layer 35 is formed on second the second n-type electrode region 323 of a corresponding discharging unit 60. The outer auxiliary conducting layer 24 is connected to the capacitive layer 35 through a via. The seal ring 222 is electrically connected to the capacitive layer 35 through the salicide layer 310 on the second n-type electrode region 323. Thus, the switch triggering units 40, the switching units 50 and the discharging units 60 are formed on the substrate 30, and the first resistor R1 and the capacitor C of each switch triggering unit are connected in series with each other through the inner auxiliary conducting layer 23 or the outer auxiliary conducting layer 24. Accordingly, the packaged IC itself has the ESD protection function without requiring any external electronic element.

In sum, the ESD protection device 3 in accordance with the present invention is arranged in a way to correspond to the coverage of the power mesh 20, thereby effectively utilizing the space of the IC 2 without further enlarging the size of the IC 2 and attaining miniaturization of electronic elements. With reference to FIGS. 5 and 12, the discharging units 60 are distributed around the core 10 of the IC 2. Wherever static electricity occurs in the power mesh 20, the present invention can rapidly respond and turn on the discharging unit 60 at the place where the static electricity occurs to shunt the energy of the static electricity to the ground and avoid damage to the core 10 of the IC 2 arising from the static electricity.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An electrostatic discharge (ESD) protection device of an integrated circuit (IC), wherein the IC has a substrate, a core and a power mesh, wherein the power mesh has at least one power electrode, a grounding electrode and a seal ring, the core is formed on the substrate and is located inside the grounding electrode, and the power mesh is located between the grounding electrode and the seal ring, the ESD protection device comprising:
   multiple discharging units formed on the substrate to correspond to a portion of the substrate covered by the power mesh, each discharging unit electrically connected between a corresponding power electrode and the grounding electrode or between a corresponding power electrode and the seal ring;
   multiple switch triggering units, each switch triggering unit electrically connected between a corresponding power electrode and the grounding electrode or between a corresponding power electrode and the seal ring to detect occurrence of static electricity; and
   multiple switching units, each switching unit electrically connected between a corresponding power electrode and the grounding electrode, and electrically connected between a corresponding switch triggering unit and a corresponding discharging unit for the corresponding switch triggering unit to turn on the corresponding discharging unit upon detecting occurrence of static electricity.

2. The ESD protection device as claimed in claim 1, wherein
each switch triggering unit has:
a first resistor; and
a capacitor connected in series with the first resistor and electrically connected between a corresponding power electrode and the grounding electrode or electrically connected between the corresponding power electrode and the seal ring;
each switching unit has:
an electronic switch having:
a first terminal electrically connected to a corresponding power electrode;
a second terminal electrically connected to the grounding electrode or the seal ring; and
a control terminal electrically connected between the first resistor and the capacitor of the switch triggering unit; and
a second resistor connected in series with the second terminal of the electronic switch, wherein a series-connected node between the electronic switch and the second resistor is connected to a control terminal of a corresponding discharging unit.

3. The ESD protection device as claimed in claim 2, wherein the substrate has a p-type well region, wherein the p-type well region corresponds to an area of the substrate covered by the power mesh and has:
a first p-type electrode region, a first n-type electrode region, a second p-type electrode region, and a second n-type electrode region electrically connected to the grounding electrode; and
a common n-type electrode region electrically connected to a corresponding power electrode;
wherein the common n-type electrode region, the first p-type electrode region and the first n-type electrode region constitute one of the discharging units, and the common n-type electrode region, the second p-type electrode region and the second n-type electrode region constitute another one of the discharging units.

4. The ESD protection device as claimed in claim 3, wherein the first p-type electrode region and the first n-type electrode region are formed next to each other, the second p-type electrode region and the second n-type electrode region are formed next to each other, and the common n-type electrode region is located between the first n-type electrode region and the second n-type electrode region.

5. The ESD protection device as claimed in claim 4, wherein two insulation layers are respectively sandwiched between the first n-type electrode region and the common n-type electrode region and between the second n-type electrode region and the common n-type electrode region.

6. The ESD protection device as claimed in claim 3, wherein the p-type well region has an n-type well region, a top portion of the n-type well region is connected to the common n-type electrode region, and a bottom portion of the n-type well region extends to a bottom portion of the substrate and is located inside the p-type well region.

7. The ESD protection device as claimed in claim 4, wherein the p-type well region has an n-type well region, a top portion of the n-type well region is connected to the common n-type electrode region, and a bottom portion of the n-type well region extends to a bottom portion of the substrate and is located inside the p-type well region.

8. The ESD protection device as claimed in claim 5, wherein the p-type well region has an n-type well region, a top portion of the n-type well region is connected to the common n-type electrode region, and a bottom portion of the n-type well region extends to a bottom portion of the substrate and is located inside the p-type well region.

9. The ESD protection device as claimed in claim 2, wherein the switching units are formed on a portion of the substrate covered by the power mesh of the IC.

10. The ESD protection device as claimed in claim 9, wherein
the substrate has a p-type well region, the p-type well region corresponds to an area of the substrate covered by the power mesh and has a first n-type well region, the first n-type well region has a first p-type electrode region, a second p-type electrode region, a third p-type electrode region, a fourth p-type electrode region, and a common n-type electrode region;
the first p-type electrode region, the second p-type electrode region and the common n-type electrode region constitute one of the electronic switches connected between a corresponding switching unit and the seal ring;
the third p-type electrode region, the fourth p-type electrode region, and the common n-type electrode region constitute another one of the switching units connected between the corresponding power electrode and the grounding electrode;
a p-type electrode region, a first n-type electrode region, and a second n-type electrode region formed inside the p-type well region constitute one of the discharging units connected between a corresponding power electrode and the seal ring; and
another p-type electrode region, another first n-type electrode region, and another second n-type electrode region formed inside the p-type well region constitute one of the discharging units connected between a corresponding power electrode and the grounding electrode.

11. The ESD protection device as claimed in claim 10, wherein each first n-type electrode region is connected to a third n-type well region.

12. The ESD protection device as claimed in claim 11, wherein two insulation layers are respectively sandwiched between the p-type electrode region and the first n-type electrode region and between the first n-type electrode region and the second n-type electrode region.

13. The ESD protection device as claimed in claim 10, wherein
the switch triggering units are formed on the substrate to correspond to a portion of the substrate covered by the power mesh;
the first resistor of each switch triggering unit is a resistive layer formed on an insulation layer, and takes a form of being repeatedly bent in opposite directions;
the capacitor of each switch triggering unit is a capacitive layer formed on a second n-type electrode region of a corresponding discharging unit;
in a distribution region of the resistive layer, the power mesh has an inner auxiliary conducting layer and an outer auxiliary conducting layer, the inner auxiliary conducting layer is located between a corresponding power electrode and the grounding electrode, the outer auxiliary conducting layer is located between a corresponding power electrode and the seal ring; and the first resistor and the capacitor of each switch triggering unit are connected in series with each other through the inner auxiliary conducting layer or the outer auxiliary conducting layer.

14. An integrated circuit (IC) device, comprising:
an IC having:
   a substrate;
   a power mesh having:
      at least one power electrode;
      a grounding electrode; and
      a seal ring; and
   a core formed on the substrate and located inside the grounding electrode; and
an electrostatic discharge (ESD) protection device having:
   multiple discharging units formed on the substrate to correspond to a portion of the substrate covered by the power mesh, each discharging unit electrically connected between a corresponding power electrode and the grounding electrode or between a corresponding power electrode and the seal ring;
   multiple switch triggering units, each switch triggering unit electrically connected between a corresponding power electrode and the grounding electrode or between a corresponding power electrode and the seal ring to detect occurrence of static electricity; and
   multiple switching units, each switching unit electrically connected between a corresponding power electrode and the grounding electrode, and electrically connected between a corresponding switch triggering unit and a corresponding discharging unit for the corresponding switch triggering unit to turn on the corresponding discharging unit upon detecting occurrence of static electricity.

15. The IC device as claimed in claim 14, wherein each switch triggering unit has:
   a first resistor; and
   a capacitor connected in series with the first resistor and electrically connected between a corresponding power electrode and the grounding electrode or electrically connected between the corresponding power electrode and the seal ring;
each switching unit has:
   an electronic switch having:
      a first terminal electrically connected to a corresponding power electrode;
      a second terminal electrically connected to the grounding electrode or the seal ring; and
      a control terminal electrically connected between the first resistor and the capacitor of the switch triggering unit; and
   a second resistor connected in series with the second terminal of the electronic switch, wherein a series-connected node between the electronic switch and the second resistor is connected to a control terminal of a corresponding discharging unit.

16. The IC device as claimed in claim 15, wherein the substrate has a p-type well region, wherein the p-type well region corresponds to an area of the substrate covered by the power mesh and has:
   a first p-type electrode region, a first n-type electrode region, a second p-type electrode region, and a second n-type electrode region electrically connected to the grounding electrode; and
   a common n-type electrode region electrically connected to a corresponding power electrode;
   wherein the common n-type electrode region, the first p-type electrode region and the first n-type electrode region constitute one of the discharging units, and the common n-type electrode region, the second p-type electrode region and the second n-type electrode region constitute another one of the discharging units.

17. The IC device as claimed in claim 16, wherein the first p-type electrode region and the first n-type electrode region are formed next to each other, the second p-type electrode region and the second n-type electrode region are formed next to each other, and the common n-type electrode region is located between the first n-type electrode region and the second n-type electrode region.

18. The IC device as claimed in claim 17, wherein two insulation layers are respectively sandwiched between the first n-type electrode region and the common n-type electrode region and between the second n-type electrode region and the common n-type electrode region.

19. The IC device as claimed in claim 16, wherein the p-type well region has an n-type well region, a top portion of the n-type well region is connected to the common n-type electrode region, and a bottom portion of the n-type well region extends to a bottom portion of the substrate and is located inside the p-type well region.

20. The IC device as claimed in claim 17, wherein the p-type well region has an n-type well region, a top portion of the n-type well region is connected to the common n-type electrode region, and a bottom portion of the n-type well region extends to a bottom portion of the substrate and is located inside the p-type well region.

21. The IC device as claimed in claim 18, wherein the p-type well region has an n-type well region, a top portion of the n-type well region is connected to the common n-type electrode region, and a bottom portion of the n-type well region extends to a bottom portion of the substrate and is located inside the p-type well region.

22. The IC device as claimed in claim 15, wherein the switching units are formed on a portion of the substrate covered by the power mesh of the IC.

23. The IC device as claimed in claim 22, wherein
   the substrate has a p-type well region, the p-type well region corresponds to an area of the substrate covered by the power mesh and has a first n-type well region, the first n-type well region has a first p-type electrode region, a second p-type electrode region, a third p-type electrode region, a fourth p-type electrode region, and a common n-type electrode region;
   the first p-type electrode region, the second p-type electrode region and the common n-type electrode region constitute one of the electronic switches connected between a corresponding switching unit and the seal ring;
   the third p-type electrode region, the fourth p-type electrode region, and the common n-type electrode region constitute another one of the switching units connected between the corresponding power electrode and the grounding electrode;
   a p-type electrode region, a first n-type electrode region, and a second n-type electrode region formed inside the p-type well region constitute one of the discharging units connected between a corresponding power electrode and the seal ring; and
   another p-type electrode region, another first n-type electrode region, and another second n-type electrode region formed inside the p-type well region constitute one of the discharging units connected between a corresponding power electrode and the grounding electrode.

24. The IC device as claimed in claim 23, wherein each first n-type electrode region is connected to a third n-type well region.

25. The IC device as claimed in claim 24, wherein two insulation layers are respectively sandwiched between the p-type electrode region and the first n-type electrode region and between the first n-type electrode region and the second n-type electrode region.

26. The IC device as claimed in claim 23, wherein
the grounding electrode of the power mesh has multiple extended portions alternately formed on an outer edge of the grounding electrode, the seal ring has multiple extended portions alternately formed on an inner edge of the seal ring and aligning with the respective extended portions of the grounding electrode, and each one of the at least one power electrode has multiple extended portions respectively formed on two opposite edges in a longitudinal direction for each extended portion on each of the two opposite edges of each one of the at least one power electrode to be inserted into an indentation between two adjacent extended portions of the grounding electrode or between the seal ring; and
the first n-type electrode region of each discharging unit located between a corresponding power electrode and the seal ring is connected to one of the extended portions of the corresponding power electrode through a via, the second n-type electrode region of the discharging unit is connected to one of the extended portions of the seal ring through another via.

27. The IC device as claimed in claim 24, wherein
the grounding electrode of the power mesh has multiple extended portions alternately formed on an outer edge of the grounding electrode, the seal ring has multiple extended portions alternately formed on an inner edge of the seal ring and aligning with the respective extended portions of the grounding electrode, and each one of the at least one power electrode has multiple extended portions respectively formed on two opposite edges in a longitudinal direction for each extended portion on each of the two opposite edges of each one of the at least one power electrode to be inserted into an indentation between two adjacent extended portions of the grounding electrode or between the seal ring; and
the first n-type electrode region of each discharging unit located between a corresponding power electrode and the seal ring is connected to one of the extended portions of the corresponding power electrode through a via, the second n-type electrode region of the discharging unit is connected to one of the extended portions of the seal ring through another via.

28. The IC device as claimed in claim 25, wherein
the grounding electrode of the power mesh has multiple extended portions alternately formed on an outer edge of the grounding electrode, the seal ring has multiple extended portions alternately formed on an inner edge of the seal ring and aligning with the respective extended portions of the grounding electrode, and each one of the at least one power electrode has multiple extended portions respectively formed on two opposite edges in a longitudinal direction for each extended portion on each of the two opposite edges of each one of the at least one power electrode to be inserted into an indentation between two adjacent extended portions of the grounding electrode or between the seal ring; and
the first n-type electrode region of each discharging unit located between a corresponding power electrode and the seal ring is connected to one of the extended portions of the corresponding power electrode through a via, the second n-type electrode region of the discharging unit is connected to one of the extended portions of the seal ring through another via.

29. The IC device as claimed in claim 23, wherein
the switch triggering units are formed on the substrate to correspond to a portion of the substrate covered by the power mesh;
the first resistor of each switch triggering unit is a resistive layer formed on an insulation layer, and takes a form of being repeatedly bent in opposite directions;
the capacitor of each switch triggering unit is a capacitive layer formed on a second n-type electrode region of a corresponding discharging unit;
in a distribution region of the resistive layer, the power mesh has an inner auxiliary conducting layer and an outer auxiliary conducting layer, the inner auxiliary conducting layer is located between a corresponding power electrode and the grounding electrode, the outer auxiliary conducting layer is located between a corresponding power electrode and the seal ring; and
the first resistor and the capacitor of each switch triggering unit are connected in series with each other through the inner auxiliary conducting layer or the outer auxiliary conducting layer.

30. The IC device as claimed in claim 24, wherein
the switch triggering units are formed on the substrate to correspond to a portion of the substrate covered by the power mesh;
the first resistor of each switch triggering unit is a resistive layer formed on an insulation layer, and takes a form of being repeatedly bent in opposite directions;
the capacitor of each switch triggering unit is a capacitive layer formed on a second n-type electrode region of a corresponding discharging unit;
in a distribution region of the resistive layer, the power mesh has an inner auxiliary conducting layer and an outer auxiliary conducting layer, the inner auxiliary conducting layer is located between a corresponding power electrode and the grounding electrode, the outer auxiliary conducting layer is located between a corresponding power electrode and the seal ring; and
the first resistor and the capacitor of each switch triggering unit are connected in series with each other through the inner auxiliary conducting layer or the outer auxiliary conducting layer.

31. The IC device as claimed in claim 25, wherein
the switch triggering units are formed on the substrate to correspond to a portion of the substrate covered by the power mesh;
the first resistor of each switch triggering unit is a resistive layer formed on an insulation layer, and takes a form of being repeatedly bent in opposite directions;
the capacitor of each switch triggering unit is a capacitive layer formed on a second n-type electrode region of a corresponding discharging unit;
in a distribution region of the resistive layer, the power mesh has an inner auxiliary conducting layer and an outer auxiliary conducting layer, the inner auxiliary conducting layer is located between a corresponding power electrode and the grounding electrode, the outer auxiliary conducting layer is located between a corresponding power electrode and the seal ring; and
the first resistor and the capacitor of each switch triggering unit are connected in series with each other through the inner auxiliary conducting layer or the outer auxiliary conducting layer.

* * * * *